United States Patent
Sone et al.

(10) Patent No.: US 10,968,517 B2
(45) Date of Patent: Apr. 6, 2021

(54) CLEANING METHOD, METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Shin Sone, Toyama (JP); Masaya Nagato, Toyama (JP); Kenji Kameda, Toyama (JP); Kotaro Konno, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/195,463

(22) Filed: Nov. 19, 2018

(65) Prior Publication Data
US 2019/0085459 A1    Mar. 21, 2019

Related U.S. Application Data

(63) Continuation of application No. PCT/JP2017/011122, filed on Mar. 21, 2017.

(30) Foreign Application Priority Data

May 20, 2016  (JP) .............................. JP2016-101122

(51) Int. Cl.
| | | |
|---|---|---|
| *H01L 21/31* | (2006.01) | |
| *H01L 21/469* | (2006.01) | |
| *C23C 16/56* | (2006.01) | |
| *C23C 16/40* | (2006.01) | |
| *C23C 16/455* | (2006.01) | |
| *H01L 21/02* | (2006.01) | |
| *C23C 16/44* | (2006.01) | |

(52) U.S. Cl.
CPC .............. *C23C 16/56* (2013.01); *C23C 16/40* (2013.01); *C23C 16/4405* (2013.01); *C23C 16/45523* (2013.01); *H01L 21/0228* (2013.01); *H01L 21/02126* (2013.01); *H01L 21/02211* (2013.01); *H01L 21/02277* (2013.01)

(58) Field of Classification Search
CPC ..... C23C 16/56; C23C 16/40; C23C 16/4405; C23C 16/44523; C23C 14/021–0221; H01L 21/02126; H01L 21/02211; H01L 21/02277; H01L 21/0228; C02F 2103/346
USPC ........................................................ 438/786
See application file for complete search history.

(56) References Cited

U.S. PATENT DOCUMENTS

| | | | |
|---|---|---|---|
| 9,142,393 B2 * | 9/2015 | Okabe | H01J 37/32862 |
| 2012/0064733 A1 | 3/2012 | Sasajima et al. | |
| 2013/0017685 A1 | 1/2013 | Akae et al. | |
| 2014/0318457 A1 * | 10/2014 | Umezawa | C23C 16/4405 |
| | | | 118/725 |
| 2015/0000695 A1 | 1/2015 | Noda et al. | |
| 2015/0267292 A1 | 9/2015 | Kim et al. | |
| 2015/0325427 A1 * | 11/2015 | Ota | C23C 16/30 |
| | | | 438/762 |
| 2015/0376781 A1 | 12/2015 | Kogura et al. | |
| 2017/0011908 A1 * | 1/2017 | Matsuoka | H01L 21/02211 |

FOREIGN PATENT DOCUMENTS

| | | |
|---|---|---|
| JP | 2004031637 A | 1/2004 |
| JP | 2012-060036 A | 3/2012 |
| JP | 2015-012198 A | 1/2015 |
| JP | 2015-185565 A | 10/2015 |
| JP | 2016-012701 A | 1/2016 |
| KR | 10-2012-0085906 A | 8/2012 |
| KR | 10-2015-0002445 A | 1/2015 |
| WO | 2011/111498 A1 | 9/2011 |

OTHER PUBLICATIONS

Korean Office Action dated Dec. 26, 2019 for the Korean Patent Application No. 10-2018-7033425.
Japanese Office Action dated Jan. 28, 2020 for the Japanese Patent Application No. 2018-518127.
Japanese Office Action dated Nov. 12, 2019 for the Japanese Patent Application No. 2018-518127.
International Search Report dated Apr. 18, 2017 of PCT International Application No. PCT/JP2017/011122.
Korean Office Action dated Oct. 29, 2020 for Korean Patent Application No. 10-2018-7033425.

* cited by examiner

*Primary Examiner* — Calvin Y Choi
(74) *Attorney, Agent, or Firm* — Volpe Koenig

(57) ABSTRACT

There is provided a cleaning technique that includes supplying a hydrogen fluoride gas into a process vessel, in which a process of forming an oxide film containing at least one of carbon and nitrogen on a substrate has been performed, to remove a deposit containing at least one of carbon and nitrogen adhered to an interior of the process vessel, wherein the act of supplying the hydrogen fluoride gas is performed under a condition in which an etching rate of the deposit adhered to the interior of the process vessel is higher than an etching rate of a quartz member in the process vessel.

13 Claims, 6 Drawing Sheets

CLEANING METHOD, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is a Bypass Continuation Application of PCT International Application No. PCT/JP2017/011122, filed on Mar. 21, 2017, the entire contents of which are incorporated herein by reference.

TECHNICAL FIELD

The present disclosure relates to a cleaning method, a method of manufacturing a semiconductor device, a substrate processing apparatus, and a recording medium.

BACKGROUND

As one of the procedures for manufacturing a semiconductor device, there is a procedure of forming a film on a substrate in a process vessel. During this film-forming process, deposits are adhered to a surface of any member in the process vessel. Therefore, a cleaning process of removing the deposits adhered to the interior of the process vessel may be performed by supplying a cleaning gas into the process vessel after performing the film-forming process.

SUMMARY

The present disclosure provides some techniques capable of improving a cleaning efficiency in a process vessel after performing a film-forming process.

According to an aspect of the present disclosure, there is provided a technique that includes supplying a hydrogen fluoride gas into a process vessel, in which a process of forming an oxide film containing at least one of carbon and nitrogen on a substrate has been performed, to remove a deposit containing at least one of carbon and nitrogen adhered to an interior of the process vessel, wherein the act of supplying the hydrogen fluoride gas is performed under a condition in which an etching rate of the deposit adhered to the interior of the process vessel is higher than an etching rate of a quartz member in the process vessel.

DETAILED DESCRIPTION

One Embodiment of the Present Disclosure

One embodiment of the present disclosure will now be described in detail with reference to FIGS. 1 to 5.

(1) Configuration of the Substrate Processing Apparatus

Figure 1:
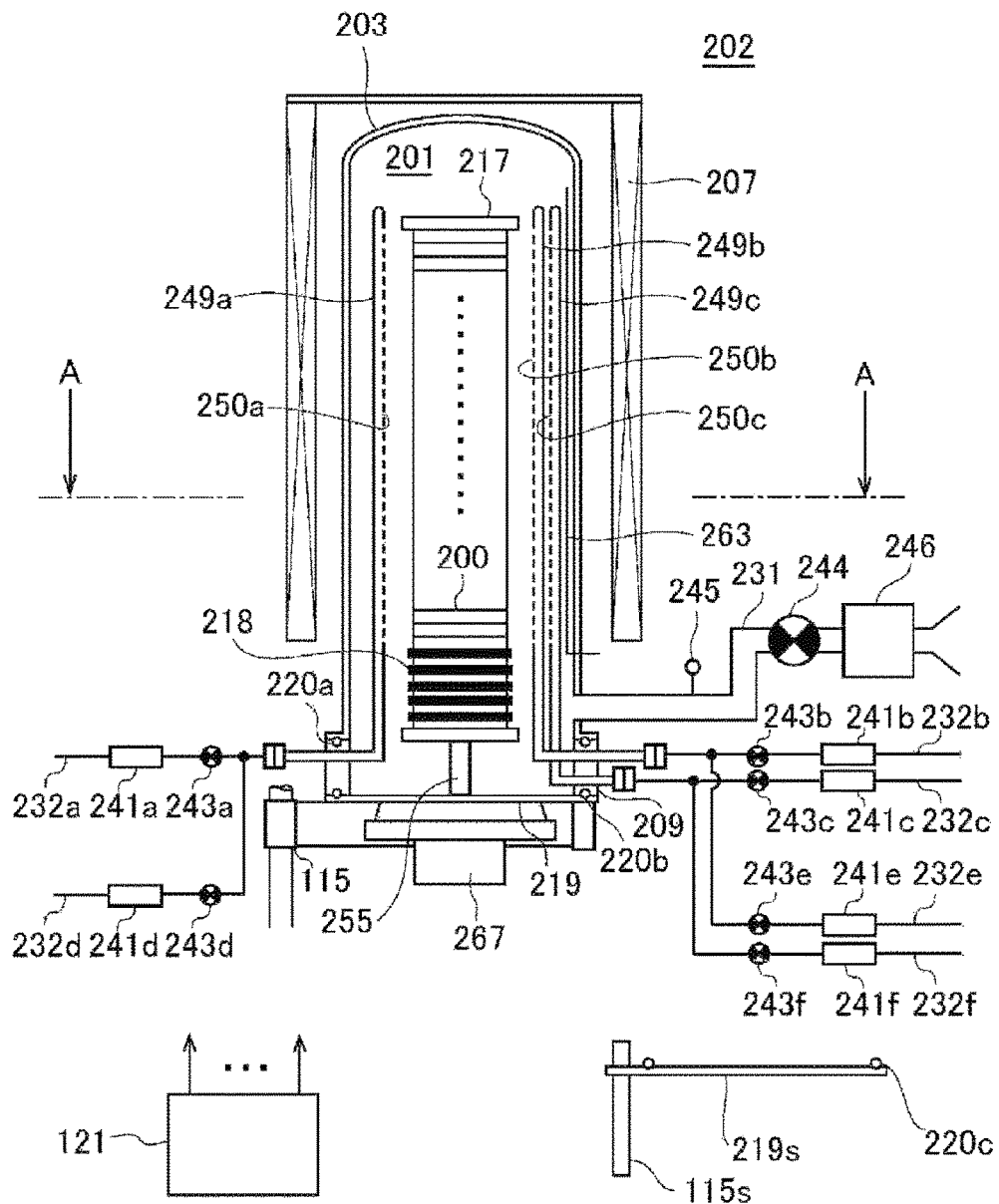
FIG. 1 is a schematic configuration diagram of a vertical-type process furnace of a substrate processing apparatus suitably used in an embodiment of the present disclosure, in which a portion of the process furnace is shown in a vertical cross sectional view.

As illustrated in FIG. 1, a process furnace 202 has a heater 207 as a heating mechanism (temperature adjustment part). The heater 207 has a cylindrical shape and is supported by a retaining plate so as to be vertically installed. The heater 207 also functions as an activation mechanism (an excitation part) configured to thermally activate (excite) a gas.

A reaction tube 203 is disposed inside the heater 207 to be concentric with the heater 207. The reaction tube 203 is made of a heat resistant material such as, e.g., quartz ($SiO_2$) or the like and has a cylindrical shape with its upper end closed and its lower end opened. A manifold 209 is disposed below the reaction tube 203 in a concentric relationship with the reaction tube 203. The manifold 209 is made of a metal material such as, e.g., stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. Similar to the heater 207, the reaction tube 203 is vertically installed. A process vessel (reaction vessel) is mainly configured by the reaction tube 203 and the manifold 209. A process chamber 201 is formed in a hollow cylindrical portion of the process vessel. The process chamber 201 is configured to accommodate wafers 200 as substrates.

Nozzles 249a to 249c are installed in the process chamber 201 so as to penetrate a sidewall of the manifold 209. Gas supply pipes 232a to 232c are respectively connected to the nozzles 249a to 249c.

Mass flow controllers (MFCs) 241a to 241c, which are flow rate controllers (flow rate control parts), and valves 243a to 243c, which are opening/closing valves, are installed in the gas supply pipes 232a to 232c sequentially from the corresponding upstream sides of gas flow, respectively. Gas supply pipes 232d to 232f for supplying an inert gas are respectively connected to the gas supply pipes 232a to 232c at the downstream side of the valves 243a to 243c. MFCs 241d to 241f and valves 243d to 243f are respectively installed in the gas supply pipes 232d to 232f sequentially from the corresponding upstream sides of gas flow.

Figure 2:
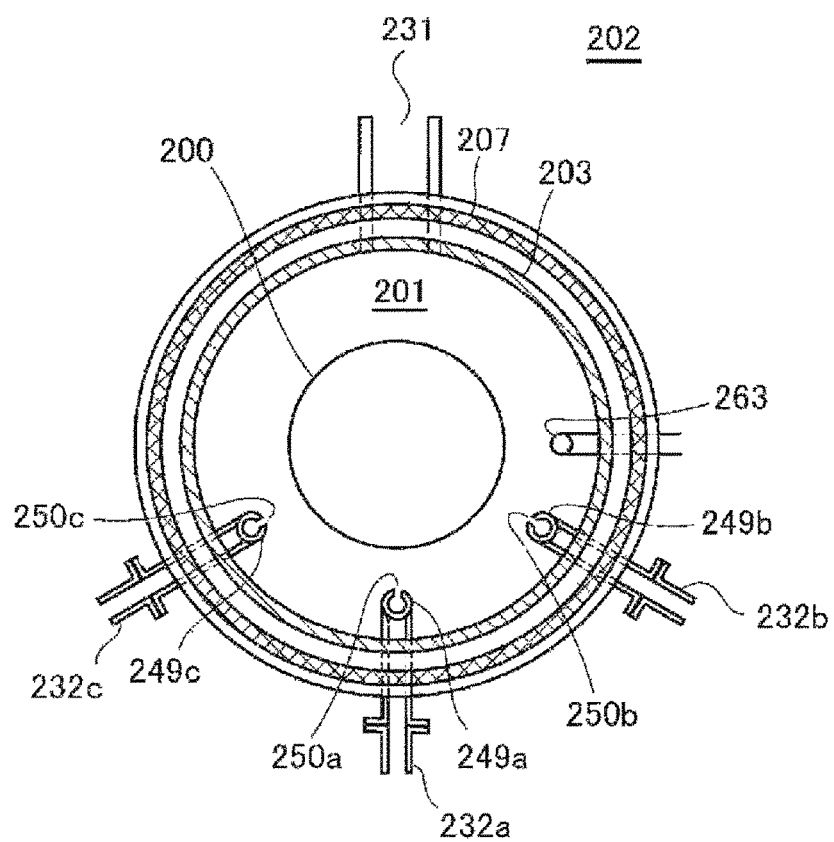
FIG. 2 is a schematic configuration diagram of the vertical-type process furnace of the substrate processing apparatus suitably used in an embodiment of the present disclosure, in which a portion of the process furnace is shown in a cross sectional view taken along line A-A in FIG. 1.

As illustrated in FIG. 2, the nozzles 249a to 249c are disposed in a space with an annular plan-view shape between the inner wall of the reaction tube 203 and the wafers 200 such that nozzles 249a and 249b extend upward along a stacking direction of the wafers 200 from a lower portion of the inner wall of the reaction tube 203 to an upper portion of the inner wall of the reaction tube 203. That is, the nozzles 249a to 249c are installed at a lateral side of a wafer arrangement region in which the wafers 200 are arranged, namely in a region which horizontally surrounds the wafer arrangement region, so as to extend along the wafer arrangement region. Gas supply holes 250a to 250c for supplying a gas are formed on the side surfaces of the nozzles 249a to 249c, respectively. The gas supply holes 250a to 250c are respectively opened toward the center of the reaction tube 203 so as to allow a gas to be supplied toward the wafers 200. The gas supply holes 250a to 250c may be formed in a plural number between the lower portion of the reaction tube 203 and the upper portion of the reaction tube 203.

A precursor (precursor gas), for example, a halosilane precursor gas which contains silicon (Si) as a predetermined element (main element) and a halogen element, is supplied from the gas supply pipe 232a into the process chamber 201 via the MFC 241a, the valve 243a, and the nozzle 249a. The precursor gas refers to a gaseous precursor, for example, a gas obtained by vaporizing a precursor which remains in a liquid state under a room temperature and an atmospheric pressure, or a precursor which remains in a gas state under a room temperature and an atmospheric pressure. The halosilane refers to a silane having a halogen group such as a chloro group or a fluoro group. As the halosilane precursor gas, it may be possible to use, for example, a precursor gas containing Si, chlorine (Cl) and an alkylene group and having an Si—C bond, namely an alkylene chlorosilane precursor gas as an organic chlorosilane precursor gas. The alkylene group includes a methylene group, an ethylene group, a propylene group, a butylene group, and the like. The alkylene chlorosilane precursor gas acts as an Si source or a C source. As the alkylene chlorosilane precursor gas, it may be possible to use, for example, a bis(trichlorosilyl) methane (($SiCl_3$)$_2CH_2$, abbreviation: BTCSM) gas.

An oxygen (O)-containing gas as a reactant (an oxidizing agent or an oxidizing gas) is supplied from the gas supply pipe 232b into the process chamber 201 via the MFC 241b, the valve 243b, and the nozzle 249b. As the O-containing gas, it may be possible to use, for example, water vapor ($H_2O$ gas). The $H_2O$ gas is a gas containing O and hydrogen (H) and containing an O—H bond, i.e., an OH group (hydroxy group).

An amine-based gas, which contains carbon (C), nitrogen (N) and H, as a catalyst gas for promoting a film-forming process as described hereinbelow, is supplied from the gas supply pipe 232c into the process chamber 201 via the MFC 241c, the valve 243c, and the nozzle 249c. As the amine-based gas, it may be possible to use a substance having an acid dissociation constant (pKa) of about 5 to 11, for example, a pyridine ($C_5H_5N$, pKa=5.67) gas. A part of the molecular structure of the amine-based gas may be decomposed in the film-forming process as described hereinbelow and therefore the amine-based gas may not be said to be a "catalyst" in the strict sense. However, in the present disclosure, a substance in which most of the amine-based gas is not decomposed even if a part of the molecular structure of the amine-based gas is decomposed in the process of chemical reaction and which acts substantially as a catalyst by changing the reaction rate will be referred to as a "catalyst". In the present disclosure, the catalyst gas used at step 1 which will be described later will also be referred to as a first catalyst gas, and the catalyst gas used at step 2 will also be referred to as a second catalyst gas.

Furthermore, in the present disclosure, the precursor gas, the reactant (oxidizing gas) and the catalyst gas will also be referred to as a film-forming gas (processing gas).

A cleaning gas, for example, a gas containing H and fluorine (F) (fluorine-based gas containing H), is supplied from the gas supply pipe 232a into the process chamber 201 via the MFC 241a, the valve 243a. and the nozzles 249a. As the gas containing H and F, it may be possible to use, for example, a hydrogen fluoride (HF) gas.

An inert gas, for example, a nitrogen ($N_2$) gas, is supplied from the gas supply pipes 232d to 232f into the process chamber 201 via the MFCs 241d to 241f, the valves 243d to 243f, the gas supply pipes 232a to 232c, and the nozzles 249a to 249c, respectively.

A precursor supply system is mainly configured by the gas supply pipe 232a, the MFC 241a, and the valve 243a. A reactant supply system is mainly configured by the gas supply pipe 232b, the MFC 241b, and the valve 243b. A catalyst supply system is mainly configured by the gas supply pipe 232c, the MFC 241c, and the valve 243c. A first supply system is configured by these supply systems. A cleaning gas supply system as a second supply system is mainly configured by the gas supply pipe 232a, the MFC 241a, and the valve 243a. An inert gas supply system is mainly configured by the gas supply pipes 232d to 232f, the MFCs 241d to 241f, and the valves 243d to 243f.

One or all of the various supply systems described above may be configured as an integrated supply system in which the valves 243a to 243f, the MFCs 241a to 241f, and the like are integrated. It is configured in a manner that the integrated supply system is connected to each of the gas supply pipes 232a to 232f so that the supply operation of various kinds of gases into the gas supply pipes 232a to 232f, namely the opening/closing operation of the valves 243a to 243f, the flow rate adjusting operation by the MFCs 241a to 241f or the like, is controlled by a controller 121 which will be described later. The integrated supply system is configured as an integral type or division type integrated unit, and is also configured such that it is detachable from the gas supply pipes 232a to 232f or the like to perform the maintenance, replacement, expansion or the like of the integrated supply system, on an integrated unit basis.

An exhaust pipe 231 configured to exhaust the internal atmosphere of the process chamber 201 is installed at a lower side of the sidewall of the reaction tube 203. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is configured so that the vacuum exhaust of the interior of the process chamber 201 and the vacuum exhaust stop can be performed by opening and closing the APC valve 244 while operating the vacuum pump 246 and so that the internal pressure of the process chamber 201 can be adjusted by adjusting the opening degree of the APC valve 244 based on the pressure information detected by the pressure sensor 245 while operating the vacuum pump 246. An exhaust system is mainly configured by the exhaust pipe 231, the APC valve 244, and the pressure sensor 245. The vacuum pump 246 may be regarded as being included in the exhaust system.

A seal cap 219, which serves as a furnace opening cover configured to hermetically seal a lower end opening of the manifold 209, is installed under the manifold 209. The seal cap 219 is made of a metal material such as, e.g., stainless steel or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described later, is installed below the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 115 is configured as a transfer device (transfer mechanism) which loads and unloads (transfers) the wafers 200 into and from the process chamber 201 by moving the seal cap 219 up and down. Furthermore, a shutter 219s as a furnace opening cover capable of hermetically sealing the lower end opening of the manifold 209, with the boat 217 unloaded from the interior of the process chamber 201 by moving the seal cap 219 down, is installed under the manifold 209. The shutter 219s is made of a metal material such as, e.g., stainless steel or the like, and is formed in a disc shape. An O-ring 220c as a seal member making contact with the lower end portion of the manifold 209 is installed on an upper surface of the shutter 219s. An opening/closing operation (an up-down movement operation or a rotational movement operation) of the shutter 219s is controlled by a shutter opening/closing mechanism 115s.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
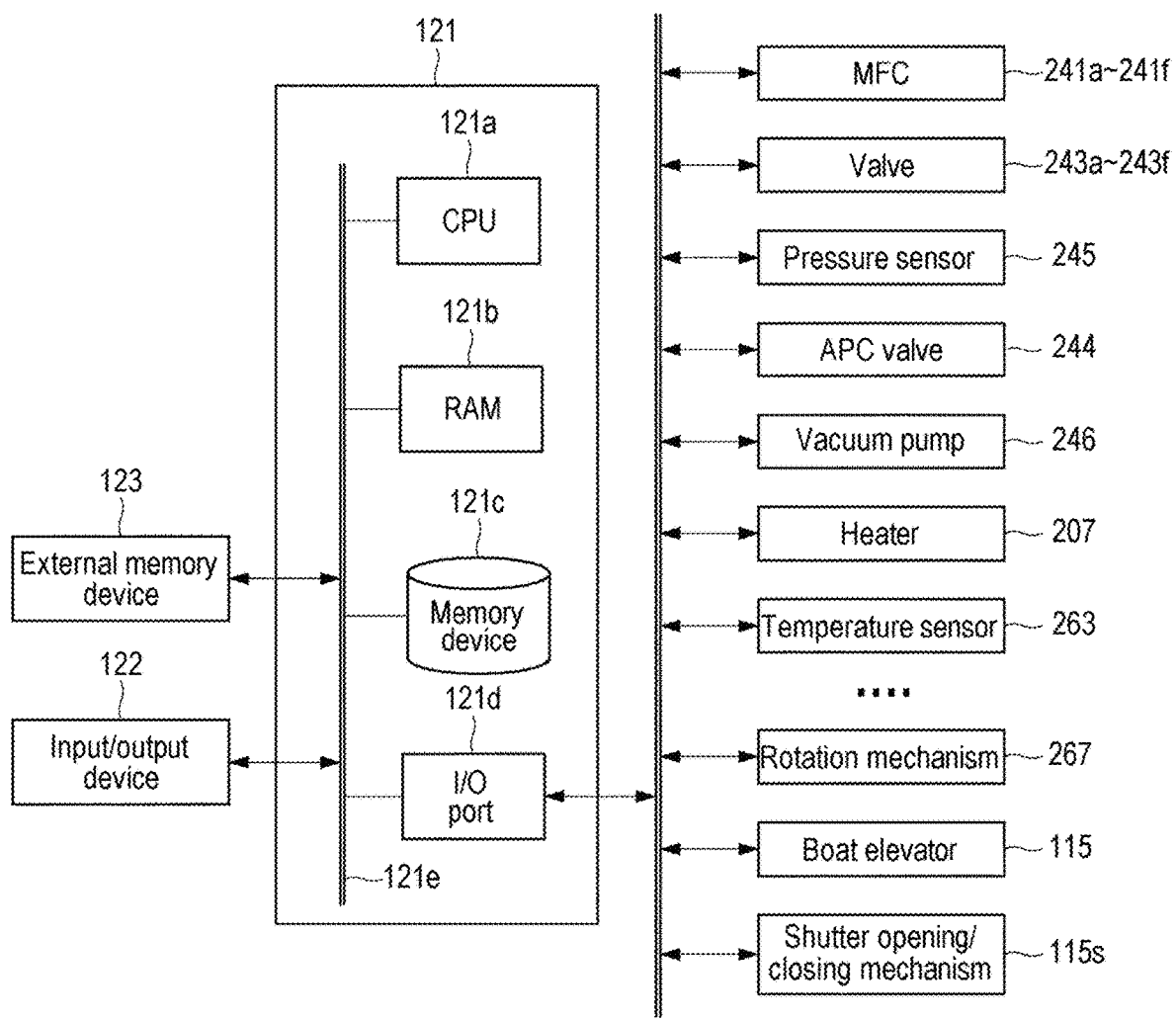
FIG. 3 is a schematic configuration diagram of a controller of the substrate processing apparatus suitably used in an embodiment of the present disclosure, in which a control system of the controller is shown in a block diagram.

As illustrated in FIG. 3, the controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disk drive (HDD), or the like. A control program for controlling operations of a substrate processing apparatus, a process recipe for specifying sequences and conditions of a film-forming process as described hereinbelow, a cleaning recipe for specifying sequences and conditions of a cleaning process as described hereinbelow, or the like is readably stored in the memory device 121c. The process recipe functions as a program for causing the controller 121 to execute each sequence in the film-forming process, as described hereinbelow, to obtain a predetermined result. The cleaning recipe also functions as a program for causing the controller 121 to execute each sequence in a cleaning process, as described hereinbelow, to obtain a predetermined result. Hereinafter, the process recipe, the cleaning recipe and the control program will be generally and simply referred to as a "program". Furthermore, the process recipe and the cleaning recipe will be generally and simply referred to as a "recipe". When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241f, the valves 243a to 243f, the pressure sensor 245, the APC valve 244, the vacuum pump 246, the temperature sensor 263, the heater 207, the rotation mechanism 267, the boat elevator 115, the shutter opening/closing mechanism 115s, and the like, as mentioned above.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to the contents of the recipe thus read, the flow rate adjusting operation of various kinds of gases by the MFCs 241a to 241f, the opening/closing operation of the valves 243a to 243f, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, the operation of opening and closing the shutter 219s with the shutter opening/closing mechanism 115s, and the like.

The controller 121 may be configured by installing, on the computer, the aforementioned program stored in an external memory device 123 (for example, a magnetic disk such as an HDD, an optical disc such as a CD, a magneto-optical disc such as an MO, or a semiconductor memory such as a USB memory). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Film-Forming Process

A sequence example of forming a film on a wafer 200 as a substrate using the aforementioned substrate processing apparatus, which is one of the processes for manufacturing a semiconductor device, will be described below with reference to FIG. 4. In the following descriptions, the operations of the respective parts constituting the substrate processing apparatus are controlled by the controller 121.

Figure 4:
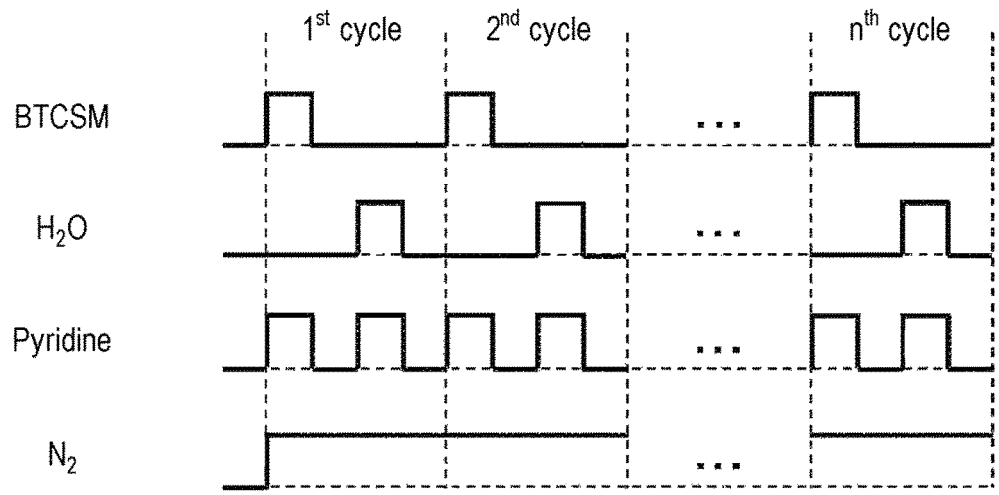
FIG. 4 is a diagram illustrating a sequence of a film-forming process according to one embodiment of the present disclosure.

In the film-forming sequence illustrated in FIG. 4, a cycle which non-simultaneously performs a step 1 of supplying a BTCSM gas and a pyridine gas to the wafer 200 in the process vessel and a step 2 of supplying an $H_2O$ gas and a pyridine gas to the wafer 200 in the process vessel is performed a predetermined number of times to form a silicon oxycarbide film (SiOC film) as a film containing Si, O and C on the wafer 200.

In the present disclosure, for the sake of convenience, the film-forming sequence illustrated in FIG. 4 may sometimes be denoted as follows. The same denotation will be used in other embodiments as described hereinbelow.

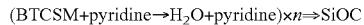

(BTCSM+pyridine→H$_2$O+pyridine)×n⇒SiOC

When the term "wafer" is used herein, it may refer to "a wafer itself" or "a laminated body of a wafer and a predetermined layer or film formed on the surface of the wafer". When the phrase "a surface of a wafer" is used herein, it may refer to "a surface of a wafer itself" or "a surface of a predetermined layer formed on a wafer." In the present disclosure, the expression "a predetermined layer is formed on a wafer" may mean that "a predetermined layer is directly formed on a surface of a wafer itself" or that "a predetermined layer is formed on a layer formed on a wafer." In addition, when the term "substrate" is used herein, it may be synonymous with the term "wafer."

(Wafer Charging and Boat Loading)

If a plurality of wafers 200 is charged on the boat 217 (wafer charging), the shutter 219s is moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

(Pressure Regulation and Temperature Adjustment)

The interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. Furthermore, the wafers 200 in the process chamber 201 are heated by the heater 207 to a desired film-forming temperature. In this operation, the state of supplying electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 begins. The operation of the vacuum pump 246 and the heating and rotation of the wafers 200 may be all continuously performed at least until the processing of the wafers 200 is completed.

(Film-Forming Step)

Next, the following two steps, i.e., steps 1 and 2, are sequentially performed.

[Step 1]

At this step, a BTCSM gas and a pyridine gas are supplied to the wafer 200 accommodated within the process vessel. Specifically, the valves 243a and 243c are opened to allow a BTCSM gas to flow through the gas supply pipe 232a and to allow a pyridine gas to flow through the gas supply pipe 232c. The flow rates of the BTCSM gas and the pyridine gas are respectively adjusted by the MFCs 241a and 241c. The BTCSM gas and the pyridine gas are supplied into the process chamber 201 via the nozzles 249a and 249c, are subsequently mixed, and are exhausted from the exhaust pipe 231. Simultaneously, the valves 243d to 243f may be opened to allow an N$_2$ gas to flow through the gas supply pipes 232d to 232f. The flow rate of the N$_2$ gas is adjusted by the MFCs 241d to 241f. The N$_2$ gas is supplied into the process chamber 201 via the nozzles 249a to 249c and is exhausted from the exhaust pipe 231.

The processing conditions at this step may be exemplified as follows:

BTCSM gas supply flow rate: 1 to 2,000 sccm, specifically 10 to 1,000 sccm

Pyridine gas supply flow rate: 1 to 2,000 sccm, specifically 10 to 1,000 sccm

N$_2$ gas supply flow rate (for each gas supply pipe): 100 to 10,000 sccm

Supply time for each gas: 1 to 100 seconds, specifically 5 to 60 seconds

Film-forming temperature (internal temperature of process chamber 201): 10 to 90 degrees C., specifically room temperature (25 degrees C.) to 70 degrees C., more specifically 50 to 70 degrees C.

Film-forming pressure (internal pressure of process chamber 201): 1 to 3,000 Pa, specifically 133 to 2,666 Pa.

When the film-forming pressure is set at a pressure (e.g., 1,333 Pa or less) which falls within the aforementioned range, if the film-forming temperature is lower than 10 degrees C., there may be a case where at least one of the BTCSM gas, the H$_2$O gas, and the pyridine gas supplied at steps 1 and 2 is likely to agglomerate, which may be liquefied. As a result, the etching resistance of the SiOC film formed on the wafer 200 to HF or the like (also referred to as HF resistance or acid resistance) may be lowered or the in-plane film thickness uniformity or the in-plane film quality uniformity of the SiOC film may be lowered. By setting the film-forming temperature to 10 degrees C. or higher, it is possible to solve these problems. By setting the film-forming temperature to become equal to or higher than a room temperature, it is easy to suppress agglomeration of gases supplied into the process chamber 201. As a result, it is possible to enhance the etching resistance of the SiOC film formed on the wafer 200 and to improve the in-plane film thickness uniformity or the in-plane film quality uniformity of the SiOC film. By setting the film-forming temperature to 50 degrees C. or higher, it is possible to reliably avoid agglomeration of gases supplied into the process chamber 201, to further enhance the etching resistance of the SiOC film formed on the wafer 200, and to further improve the in-plane film thickness uniformity or the in-plane film quality uniformity of the SiOC film.

Furthermore, when the film-forming pressure is set at a pressure (e.g., 1,333 Pa or less) which falls within the aforementioned range, if the film-forming temperature exceeds 90 degrees C., there may a case where it becomes difficult for the film-forming reaction to the wafer 200 to decrease the thickness of a layer formed per one cycle (lower the cycle rate). As a result, the deposition rate of the SiOC film may be lowered. By setting the film-forming temperature at 90 degrees C. or lower, it is possible to solve this problem. By setting the film-forming temperature at 70 degrees C. or lower, it is possible to reliably secure (maintain) a practical level cycle rate, i.e., a practical level deposition rate.

By supplying the BTCSM gas and the pyridine gas to the wafer 200 under the aforementioned conditions, an Si-containing layer containing C and Cl and having a thickness of, for example, approximately from less than one atomic layer (one molecular layer) to several atomic layers (several molecular layers), is formed as a first layer on the uppermost surface of the wafer 200. The Si-containing layer containing C and Cl is a layer containing an Si—C bond. The Si-containing layer containing C and Cl may be an Si layer containing C and Cl or an adsorption layer of BTCSM, or may include both of them. Furthermore, in the present disclosure, for the sake of convenience, the Si-containing layer containing C and Cl will be simply referred to as an Si-containing layer containing C.

The Si layer containing C and Cl includes not only a continuous layer formed of Si and containing C and Cl but also a discontinuous layer or an Si thin film containing C and Cl formed by overlapping these layers. Si constituting the Si layer containing C and Cl includes not only those in which a bond with C or Cl is not completely broken but also those in which a bond with C or Cl is completely broken.

The adsorption layer of BTCSM includes not only a continuous adsorption layer formed of BTCSM molecules but also a discontinuous adsorption layer. The BTCSM molecules constituting the adsorption layer of BTCSM include those in which a bond of Si and C is partially broken, and those in which a bond of Si and Cl is partially broken, namely some thereof are decomposed. That is, the adsorption layer of BTCSM may be a physisorption layer of BTCSM or a chemisorption layer of BTCSM, or may include both of them.

In this regard, the layer having a thickness of less than one atomic layer (molecular layer) refers to an atomic layer (molecular layer) formed discontinuously, and the layer having a thickness of one atomic layer (molecular layer) refers to an atomic layer (molecular layer) formed continuously. The Si-containing layer containing C and Cl may include both the Si layer containing C and Cl and the adsorption layer of BTCSM. However, since both have the same structure in which C or Cl is bonded to the main element (Si), for the sake of convenience, the Si-containing layer containing C and Cl may be expressed as "one atomic layer", "several atomic layers" or the like and the "atomic layer" may be used synonymously with the "molecular layer".

If the thickness of the first layer exceeds several atomic layers, an oxidizing action at step 2 as described hereinbelow fails to reach the entirety of the first layer. A minimum value of the thickness of the first layer is less than one atomic layer. Accordingly, it is desirable that the thickness of the first layer be approximately from less than one atomic layer to several atomic layers. By setting the thickness of the first layer at one atomic layer or less, it is possible to relatively increase the oxidizing action at step 2 as described hereinbelow, and to shorten the time required for the oxidizing action at step 2. It is also possible to shorten the time required in forming the first layer at step 1. As a result, it is possible to shorten the processing time per one cycle and to shorten the total processing time. That is, it is also possible to increase the deposition rate. Furthermore, by setting the thickness of the first layer at one atomic layer or less, it is possible to enhance the controllability of the film thickness uniformity.

The Si layer containing C and Cl is formed by depositing Si on the wafer 200 under a condition that the BTCSM gas is autolyzed (pyrolyzed). The adsorption layer of BTCSM is formed by adsorbing BTCSM on the wafer 200 under a condition that the BTCSM gas is not autolyzed (pyrolyzed). Under either condition, at least some of Si—C bonds contained in the BTCSM gas are held (maintained) without being broken and are directly introduced into the first layer. It is more desirable to form the Si layer containing C and Cl on the wafer 200 than to form the adsorption layer of BTCSM on the wafer 200 because the former can further increase the deposition rate. However, in the present embodiment, since the temperature of the wafer 200 is set at a low temperature of, for example, 90 degrees C. or lower, the adsorption layer of BTCSM, rather than the Si layer containing C and Cl, is more likely to be formed on the wafer 200.

The pyridine gas acts as a catalyst gas (first catalyst gas) which weakens a bonding force of an O—H bond existing on the surface of the wafer 200, promotes decomposition of the BTCSM gas, and promotes formation of the first layer by chemisorption of BTCSM molecules. For example, the pyridine gas acts on the O—H bond existing on the surface of the wafer 200 so as to weaken the bonding force thereof. H whose bonding force is weakened reacts with Cl of the BTCSM gas to generate a gaseous substance containing Cl and H. Therefore, H desorbs from the surface of the wafer 200 and Cl also desorbs from the BTCSM molecules. The BTCSM molecules whose Cl is lost chemisorb on the surface of the wafer 200 or the like. Accordingly, a chemisorption layer of BTCSM, more precisely, a chemisorption layer of a substance obtained by decomposing part of BTCSM, is formed as the first layer on the wafer 200.

The reason why the bonding force of the O—H bond existing on the surface of the wafer 200 is weakened by the catalytic action of the pyridine gas is that N having a lone pair of electrons in the pyridine molecules acts to attract H. For compounds with large pKa, the force attracting H becomes stronger. By using a compound having pKa of 5 or more as the first catalyst gas, it is possible to promote the decomposition of BTCSM and to promote the formation of the first layer by chemisorption. However, when a compound with excessively large pKa is used as the first catalyst gas, there may be a case where Cl drawn out from the BTCSM molecules reacts with the first catalyst gas to generate salt (particle source) such as ammonium chloride ($NH_4Cl$) or the like. Therefore, it is desirable to use a compound having pKa of, for example, 11 or less, specifically 7 or less, as the first catalyst gas. Since the pyridine gas has relatively large pKa of about 5.67 and is 7 or less, it can be appropriately used as the first catalyst gas.

After the first layer is formed, the valves 243a and 243c are closed to stop the supply of each of the BTCSM gas and the pyridine gas into the process chamber 201. Then, the interior of the process chamber 201 is vacuum-exhausted and the gas or the like remaining within the process chamber 201 is removed from the interior of the process chamber 201. At this time, the supply of the $N_2$ gas into the process chamber 201 is maintained, with the valves 243d to 243f opened. The $N_2$ gas acts as a purge gas and the interior of the process chamber 201 is thus purged.

[Step 2]

After step 1 is completed, an $H_2O$ gas and a pyridine gas are supplied to the wafer 200 accommodated within the process vessel. At this step, the opening/closing control of the valves 243b, 243c, and 243d to 243f is performed in the same procedure as the opening/closing control of the valves 243a, 243c, and 243d to 243f at step 1. The flow rates of the $H_2O$ gas and the pyridine gas are adjusted by the MFCs 241b and 241c, respectively. The $H_2O$ gas and the pyridine gas are supplied into the process chamber 201 via the nozzles 249b and 249c, are subsequently mixed, and are exhausted from the exhaust pipe 231.

The processing conditions at this step may be exemplified as follows:

$H_2O$ gas supply flow rate: 10 to 10,000 sccm, specifically 100 to 1,000 sccm

Pyridine gas supply flow rate: 1 to 2,000 sccm, specifically 10 to 1,000 sccm

Supply time for each gas: 1 to 100 seconds, specifically 5 to 60 seconds.

Other processing conditions may be similar to, for example, the processing conditions of step 1. Furthermore, the amount of the pyridine gas supplied at step 2 and the amount of the pyridine gas supplied at step 1 may be the same or different.

By supplying the $H_2O$ gas and the pyridine gas to the wafer 200 under the aforementioned conditions, at least part of the first layer formed on the wafer 200 at step 1 is oxidized (modified). By modifying the first layer, a second layer containing Si, O and C, i.e., a silicon oxycarbide layer (SiOC layer), is formed. When forming the second layer, at least some of Si—C bonds contained in the first layer are maintained without being broken and are directly introduced into (are left on) the second layer. When forming the second layer, an impurity such as Cl or the like contained in the first layer, which constitutes a gaseous substance containing at least Cl in the process of the modifying reaction with the $H_2O$ gas, is discharged from the interior of the process chamber 201. That is, the impurity such as Cl in the first layer is drawn out or desorbed from the interior of first layer so as to be separated from the first layer. Thus, the second layer becomes a layer having less impurity such as Cl than the first layer.

The pyridine gas acts as a catalyst gas (second catalyst gas) which weakens a bonding force of an O—H bond possessed by the $H_2O$ gas, promotes decomposition of the $H_2O$ gas, and promotes formation of the second layer by the action of the $H_2O$ gas and the first layer. For example, the pyridine gas acts on the O—H bond possessed by the $H_2O$ gas so as to weaken the bonding force thereof. H whose bonding force is weakened reacts with Cl of the first layer formed on the wafer 200 to generate a gaseous substance containing Cl and H. Therefore, H desorbs from the $H_2O$ molecules and Cl also desorbs from the first layer. O of the $H_2O$ gas whose H is lost bonds with Si of the first layer whose Cl is desorbed and at least some of C atoms remain. Accordingly, the oxidized first layer, i.e., the second layer, is formed on the wafer 200.

The reason why the bonding force of the O—H bond possessed by the $H_2O$ gas is weakened by the catalytic action of the pyridine gas is that N having a lone pair of electrons in the pyridine molecules acts to attract H as at step 1. By using a compound having pKa of 5 or more as the catalyst gas, it is possible to moderately weaken the bonding force of the O—H bond possessed by the $H_2O$ gas, and to promote the aforementioned oxidizing reaction. Therefore, it is desirable to use a compound having pKa of, for example, 11 or less, specifically 7 or less, as the second catalyst gas. Similar to step 1, for example, the pyridine gas may be appropriately used.

After the second layer is formed, the valves 243b and 243c are closed to stop the supply of each of the $H_2O$ gas and the pyridine gas into the process chamber 201. Then, the gas or the like remaining within the process chamber 201 is removed from the interior of the process chamber 201 according to the same processing procedures as those of step 1.

[Performing a Predetermined Number of Times]

A cycle which non-simultaneously, i.e., non-synchronously, and alternately performs steps 1 and 2 described above is implemented a predetermined number of times (n times) (where n is an integer of 1 or more). Thus, an SiOC film having a predetermined composition and a predetermined thickness can be formed on the wafer 200. The aforementioned cycle may be repeated multiple times. That is, the thickness of the second layer (SiOC layer) formed per one cycle may be set smaller than a desired thickness and the aforementioned cycle may be repeated multiple times until the thickness of the SiOC film formed by laminating the second layer becomes equal to the desired thickness.

As the precursor, it may be possible to use, in addition to the BTCSM gas, an alkylene chlorosilane precursor gas such as a 1,2-bis (trichlorosilyl) ethane (($SiCl_3)_2C_2H_4$, abbreviation: BTCSE) gas or the like. As the precursor, it may also be possible to use, for example, an alkylchlorosilane precursor gas such as a 1,1,2,2-tetrachloro-1,2-dimethyldisilane (($CH_3)_2Si_2Cl_4$, abbreviation: TCDMDS) gas, a 1,2-dichloro-1,1,2,2-tetramethyldisilane (($CH_3)_4Si_2Cl_2$, abbreviation: DCTMDS) gas or a 1-monochloro-1,1,2,2,2-pentamethyldisilane (($CH_3)_5Si_2Cl$, abbreviation MCPMDS) gas, or an inorganic chlorosilane precursor gas such as a hexachlorodisilane ($Si_2Cl_6$: abbreviation: HCDS) gas or an octachlorotrisilane ($Si_3Cl_8$, abbreviation: OCTS) gas.

As the reactant, it may be possible to use, in addition to the $H_2O$ gas, for example, an O-containing gas containing an O—H bond such as a hydrogen peroxide ($H_2O_2$) gas or the like. As the reactant, it may also be possible to use, an O-containing gas containing no O—H bond, for example, an oxygen ($O_2$) gas, an ozone ($O_3$) gas, a hydrogen ($H_2$) gas+an $O_2$ gas, an $H_2$ gas+an $O_3$ gas, or the like.

As the first and second catalyst gases, it may be possible to use, in addition to the pyridine gas, a cyclic amine-based gas such as an aminopyridine ($C_5H_6N_2$, pKa=6.89) gas, a picoline ($C_6H_7N$, pKa=6.07) gas, a lutidine ($C_7H_9N$, pKa=6.96), a piperazine ($C_4H_{10}N_2$, pKa=9.80) gas or a piperidine ($C_5H_{11}N$, pKa=11.12) gas, a chain amine-based gas such a triethylamine (($C_2H_5)_3N$, abbreviation: TEA, pKa=10.7) gas, a diethylamine (($C_2H_5)_2NH$), abbreviation: DEA, pKa=10.9) gas, a monoethylamine (($C_2H_5)NH_2$, abbreviation: MEA, pKa=10.6) gas, a trimethylamine ($(CH_3)_3N$, abbreviation: TMA, pKa=9.8) gas or a monomethylamine (($CH_3)NH_2$, abbreviation: MMA, pKa=10.6) gas, or a non-amine-based gas such as an ammonia ($NH_3$, pKa=9.2) gas or the like. As the first and second catalyst gases, it may also possible to use different kinds of gases.

(After Purge to Atmospheric Pressure Return)

After the formation of the SiOC film is completed, the $N_2$ gas as a purge gas is supplied from each of the nozzles 249a to 249c into the process chamber 201 and is exhausted from the exhaust pipe 231. Thus, the interior of the process chamber 201 is purged, and the gas or the reaction byproduct, which remains within the process chamber 201, is removed from the interior of the process chamber 201 (after purge). Thereafter, the internal atmosphere of the process chamber 201 is substituted by an inert gas (inert gas substitution). The internal pressure of the process chamber 201 is returned to an atmospheric pressure (atmospheric pressure return).

(Boat Unloading and Wafer Discharging)

The seal cap 219 is moved down by the boat elevator 115 to open the lower end of the manifold 209. The processed wafers 200 supported on the boat 217 are unloaded from the lower end of the manifold 209 to the outside of the reaction tube 203 (boat unloading). After the boat unloading, the shutter 219s is moved so that the lower end opening of the manifold 209 is sealed by the shutter 219s through the O-ring 220c (shutter closing). The processed wafers 200 are unloaded to the outside of the reaction tube 203 and are subsequently discharged from the boat 217 (wafer discharging).

(3) Cleaning Process

When the film-forming process described above is performed, a deposit containing the thin film such as the SiOC film or the reaction byproduct is accumulated in the surface of any member in the process chamber 201, for example, the inner wall of the reaction tube 203, the inner wall and the surface of the nozzles 249a to 249c, the surface of the boat 217, the inner wall of the manifold 209, or the like. That is, an oxide deposit containing C (a deposit containing SiOC as a main component, hereinafter also referred to simply as a "deposit") adheres to the surface of the member in the process chamber 201 to be accumulated. Therefore, when the amount of the deposit, i.e., the cumulative film thickness, reaches a predetermined amount (thickness) before the occurrence of peeling or dropping of the deposit, a cleaning process is performed.

Figure 5:
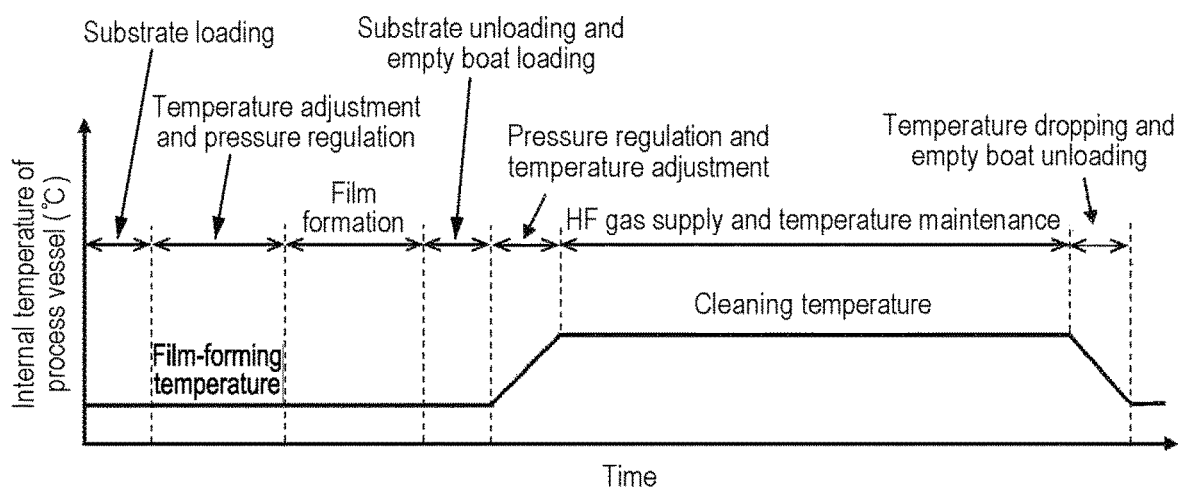
FIG. 5 is a diagram illustrating a sequence of a cleaning process according to one embodiment of the present disclosure.

Hereinafter, an example of a cleaning process according to the present embodiment will be described with reference to FIG. 5. In the following description, the operations of the respective parts constituting the substrate processing apparatus are controlled by the controller 121.

(Boat Loading)

The shutter 219s is moved by the shutter opening/closing mechanism 115s to open the lower end opening of the manifold 209 (shutter opening). Thereafter, the empty boat 217 not charged with the wafers 200 is lifted up by the boat elevator 115 and is loaded into the process chamber 201. In this state, the seal cap 219 seals the lower end of the manifold 209 through the O-ring 220b.

(Pressure Regulation and Temperature Adjustment)

The interior of the process chamber 201 is vacuum-exhausted by the vacuum pump 246 so as to reach a desired pressure. Furthermore, the interior of the process chamber 201 is heated by the heater 207 so as to reach a desired temperature. The rotation of the boat 217 by the rotation mechanism 267 begins. The operation of the vacuum pump 246, the heating of the interior of the process chamber 201 and the rotation of the boat 217 may be continuously performed at least until a cleaning step as described hereinbelow is completed. However, it is not necessary to rotate the boat 217.

(Cleaning Step)

Next, an HF gas as a second cleaning gas is supplied into the process vessel, namely into the process chamber 201 with adhered deposit containing C, after performing the aforementioned film-forming process. At this step, the opening/closing control of the valves 243a and 243d to 243f, with the valves 243b and 243c closed, is performed in the same procedure as the opening/closing control of the valves 243a and 243d to 243f at step 1 of the film-forming process. The flow rate of the HF gas is adjusted by the MFC 241a. The HF gas is supplied into the process chamber 201 via the gas supply pipe 232a and the nozzle 249a.

When the HF gas supplied into the process chamber 201 passes the interior of the process chamber 201 and is exhausted from the exhaust pipe 231, it makes contact with the surface of any member in the process chamber 201, for example, the inner wall of the reaction tube 203, the surface of the nozzles 249a to 249c, the surface of the boat 217, the inner wall of the manifold 209, the upper surface of the seal cap 219, or the like. At this time, a thermochemical reaction (etching reaction) occurs between the HF gas and the deposit, and as a result, the deposit is removed from the interior of the process chamber 201.

The processing conditions at this step may be exemplified as follows:

HF gas supply flow rate: 1,000 to 8,000 sccm, specifically 2,000 to 8,000 sccm $N_2$ gas supply flow rate (for each gas supply pipe): 0 to 10,000 sccm Supply time for each gas: 60 to 1,800 seconds, specifically 120 to 1,200 seconds Cleaning temperature (internal temperature of process chamber 201): temperature higher than film-forming temperature, for example, 100 to 400 degrees C., specifically 200 to 300 degrees C.

Cleaning pressure (internal pressure of process chamber 201): 1,333 to 26,660 Pa (10 to 200 Torr), specifically 1,333 to 13,360 Pa (10 to 100 Torr).

If the cleaning temperature is lower than 100 degrees C., the etching rate of SiO (oxide containing neither C nor N) may be larger than the etching rate of SiOC (oxide containing C). Specifically, the etching of SiO goes ahead at a relatively high speed, while the etching of SiOC may not substantially occur. Furthermore, the present inventors confirmed that the etching of any quartz member in the process chamber 201 with the HF gas, namely a member such as the boat 217, the nozzles 249a to 249c, the reaction tube 203 or the like, shows the same tendency as the etching of SiO with the HF gas. That is, there may be a case where the etching of the quartz member in the process chamber 201 goes ahead at a relatively high speed under the aforementioned conditions. As a result, it becomes difficult to remove the deposit from the interior of the process chamber 201, and the quartz member in the process chamber 201 may suffer significant etching damage.

If the cleaning pressure is less than 10 Torr, there may be a case where the etching of SiO hardly goes ahead and the etching rate of SiOC is also lowered, reducing the removal efficiency of the deposit. If it is attempted to remove the deposit under the condition of poor etching selectivity as described above, the time required for the cleaning process and the gas cost may increase.

By setting the cleaning temperature at a temperature of 100 degrees C. or higher or by setting the cleaning pressure at a pressure of 10 Torr or more, it is possible to make the etching rate of SiOC larger than the etching rate of SiO. Specifically, it is possible to allow the etching of SiOC to go ahead at a practical rate while allowing the etching of SiO to hardly go ahead. That is, it is possible to efficiently remove the deposit adhered to the interior of the process chamber 201 while avoiding the etching damage of the quartz member in the process chamber 201. By setting the cleaning temperature at a temperature of 200 degrees C. or higher, it is possible to more reliably obtain the aforementioned effects.

If the cleaning temperature exceeds 400 degrees C., there may be a case where the etching of SiO hardly goes ahead and the etching rate of SiOC is also lowered, reducing the removal efficiency of the deposit. If it is attempted to remove the deposit under the condition of poor etching selectivity as described above, the time required for the cleaning process and the gas cost may increase.

If the cleaning pressure exceeds 200 Torr, there may be a case where the etching rate of SiOC is increased, the etching rate of SiO is also increased, the etching selectivity is lowered, and the quartz member also suffers significant etching damage.

By setting the cleaning temperature at a temperature of 400 degrees C. or lower or by setting the cleaning pressure at a pressure of 200 Torr or less, it is possible to selectively increase the etching rate of SiOC while suppressing an increase in the etching rate of SiO. That is, it is possible to efficiently remove the deposit from the interior of the process chamber 201 while suppressing the etching damage of the quartz member in the process chamber 201. By setting the cleaning temperature at a temperature of 300 degrees C. or lower or by setting the cleaning pressure at a pressure of 100 Torr or less, it is possible to more reliably obtain the aforementioned effects.

The aforementioned cleaning temperature and cleaning pressure conditions may also be said to be conditions under which the etching rate of SiOC can be larger than the etching rate of SiO, namely conditions under which desired or predetermined etching selectivity can be obtained. Furthermore, these conditions can be said to be conditions that can remove a deposit while suppressing etching damage of the quartz member, namely conditions that obtain etching selectivity between the deposit and the quartz member.

By setting the entire interior of the process chamber 201 to such processing conditions when performing the cleaning step, it is possible to efficiently remove the deposit while avoiding etching damage of the quartz member throughout the interior of the process chamber 201. For example, by heating the periphery of the furnace opening (low temperature region or heat insulating region) of the process vessel which is difficult to be heated to a temperature of 100 degrees C. or higher, it is possible to remove a relatively weak deposit (a deposit in powder form) adhered to such a region. In this case, the substrate accommodating region which is easy to be heated by the heater 207 is naturally heated to a temperature of 100 degrees C. or higher. Thus, it is also possible to remove even a relatively dense deposit adhered to such a region.

(After Purge to Atmospheric Pressure Return)

After the cleaning step is completed, the valve 243a is closed to stop the supply of the HF gas into the process chamber 201. Then, the interior of the process chamber 201 is purged in the same processing procedure as the after purge of the film-forming process (after purge). At this time, the interior of the process chamber 201 may be intermittently purged by repeating the opening/closing operation of the valves 243d to 243f (cycle purge). Thereafter, the internal atmosphere of the process chamber 201 is substituted by an $N_2$ gas (inert gas substitution). The internal pressure of the process chamber 201 is returned to an atmospheric pressure (atmospheric pressure return).

(Boat Unloading)

The seal cap 219 is moved down by the boat elevator 115 to open the lower end of the manifold 209. The empty boat 217 is unloaded from the lower end of the manifold 209 to the outside of the reaction tube 203 (boat unloading). After the boat unloading, the shutter 219s is moved so that the lower end opening of the manifold 209 is sealed by the shutter 219s through the O-ring 220c. When these series of steps are completed, the film-forming process described above is resumed.

(4) Effects According to the Present Embodiment

According to the present embodiment, one or more effects as set forth below may be achieved.

(a) By using the HF gas as the cleaning gas and by setting the processing conditions such as the cleaning temperature and the cleaning pressure to predetermined conditions which fall within the aforementioned processing condition range when performing the cleaning step, it is possible to efficiently remove the deposit containing C while avoiding the etching damage of any quartz member in the process chamber 201.

Furthermore, as described above, in the case where the HF gas is used as the cleaning gas, if the cleaning temperature is set at a temperature of, for example, 30 degrees C. or higher and less than 100 degrees C., the etching rate of the quartz member may be larger than the etching rate of SiOC. This not only makes it difficult to remove the deposit containing C from the interior of the process chamber 201 but also makes the quartz member in the process chamber 201 susceptible to etching damage. In addition, in the case where the fluorine ($F_2$) gas is used as the cleaning gas, it is necessary to set the cleaning temperature at, for example, a temperature of 300 degrees C. or higher and 400 degrees C. or lower. In this case, it is difficult to obtain the same etching selectivity as in the present embodiment, and even if the deposit could be removed from the process chamber 201, the quartz member in the process chamber 201 may be susceptible to etching damage. Moreover, in the case where the $F_2$ gas is used as the cleaning gas, there may be a case where the reaction byproduct containing F is generated on the surface of the deposit. This may make it more difficult to remove the deposit.

The "phenomenon of etching selectivity of the HF gas to the deposit containing C which is developed under the specific temperature and pressure conditions" described above has been clarified by extensive research of the inventors of the present disclosure.

(b) By setting the entire interior of the process chamber 201 to the aforementioned processing conditions when performing the cleaning step, it is possible to remove the deposit containing C while avoiding the etching damage of the quartz member throughout the interior of the process chamber 201. For example, it is possible to reliably remove not only a relatively dense deposit adhered to the substrate accommodating region but also a relatively weak deposit adhered to the periphery of the furnace opening of the process vessel. This makes it unnecessary to wipe the deposit around the furnace opening after the cleaning process. Moreover, it is possible to shorten the down time of the substrate processing apparatus and to reduce the maintenance cost.

(c) The effects mentioned above can be similarly achieved in the case where the aforementioned precursor other than the BTCSM gas is used, in the case where the aforementioned reactant other than the $H_2O$ gas is used, or in the case where the aforementioned catalyst other than the pyridine gas is used.

In addition, the effects mentioned above can be similarly achieved even in the case of cleaning the interior of the process vessel after performing a process of forming a silicon oxycarbonitride film (SiOCN film) or a silicon oxynitride film (SiON film) on the wafer 200 by, for example, the film-forming sequences denoted below.

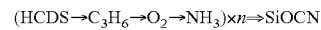

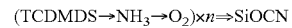

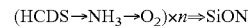

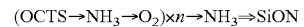

In these film-forming sequences, there may be a case where salt such as $NH_4Cl$ is more likely to be generated in the course of the film-forming process than in the film-forming sequence illustrated in FIG. 4, and thus, a large amount of deposit containing the salt, oxide or the like (a deposit containing at least one of C and N) adheres to the surface of any member in the process chamber 20. Furthermore, in the case of forming the SiOCN film, a large amount of oxidized deposit containing C and N (a deposit containing SiOCN as a main component) may adhere to the surface of the member in the process chamber 201, and in the case of forming the SiON film, a large amount of oxidized deposit containing N (a deposit containing SiON as a main component) may adhere to the surface of the member in the process chamber 201. In a cleaning method different from the present embodiment, the deposit containing such salt or the like tends to be difficult to be removed by a conventional cleaning process in which, for example, the HF gas is used as the cleaning gas and the cleaning temperature is set at a temperature of, for example, 30 degrees C. or higher and less than 100 degrees C., or by a conventional cleaning process in which the $F_2$ gas is used as the cleaning gas and the cleaning temperature is set at a temperature of, for example, 300 degrees C. or higher and 400 degrees C. or lower. On the other hand, in the cleaning process according to the present embodiment, it is possible to efficiently remove the deposit while avoiding the etching damage of the quartz member in the process chamber 201 even with the deposit containing such salt or the like.

Other Embodiments

While one embodiment of the present disclosure has been specifically described above, the present disclosure is not limited to the aforementioned embodiment but may be differently modified without departing from the spirit of the present disclosure.

In the aforementioned embodiment, there has been described an example in which the HF gas is supplied into the process chamber 201 via the nozzle 249a, but the present disclosure is not limited thereto. For example, the HF gas may be supplied into the process chamber 201 via the nozzle 249b or the nozzle 249c. The HF gas may also be supplied into the process chamber 201 using a plurality of nozzles simultaneously or alternately.

In the aforementioned embodiment, there has been described an example in which a film containing Si as a main element and further containing at least one of C and N is formed on the substrate, but the present disclosure is not limited thereto. That is, the present disclosure may be suitably applied to a case where the interior of the process vessel is cleaned after performing a process of forming a film containing as a main element a semimetal element such as germanium (Ge), boron (B) or the like, in addition to Si, and further containing at least one of C and N on the substrate. In addition, the present disclosure may be suitably applied to a case where the interior of the process vessel is cleaned after performing a process of forming a film containing a metallic element such as titanium (Ti), zirconium (Zr), hafnium (Hf), niobium (Nb), tantalum (Ta), molybdenum (Mo), tungsten (W), yttrium (Y), strontium (Sr), aluminum (Al) or the like as a main element, and further containing at least one of C and N on the substrate.

Even in these cases, the processing procedures and processing conditions of the cleaning process may be similar to the processing procedures and processing conditions of the aforementioned embodiment. Even in these cases, the same effects as those of the aforementioned embodiment may be achieved.

Recipes used in substrate processing or cleaning process may be prepared individually according to the processing contents and may be stored in the memory device 121c via a telecommunication line or the external memory device 123. Moreover, at the start of the substrate processing or the cleaning process, the CPU 121a may properly select an appropriate recipe from among the plurality of recipes stored in the memory device 121c according to the processing contents. Thus, it is possible for a single substrate processing apparatus to form films of different kinds, composition ratios, qualities and thicknesses with enhanced reproducibility. In addition, it is possible to reduce an operator's burden and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described an example in which films are formed using a batch-type substrate processing apparatus capable of processing a plurality of substrates at a time. The present disclosure is not limited to the aforementioned embodiment but may be appropriately applied to, e.g., a case where films are formed using a single-wafer-type substrate processing apparatus capable of processing a single substrate or several substrates at a time. In addition, in the aforementioned embodiment, there has been described an example in which films are formed using a substrate processing apparatus provided with a hot-wall-type process furnace. The present disclosure is not limited to the aforementioned embodiment but may be appropriately applied to a case where films are formed using a substrate processing apparatus provided with a cold-wall-type process furnace.

In the case of using these substrate processing apparatuses, a film-forming process may be performed by the processing procedures and processing conditions similar to those of the aforementioned embodiment. Effects similar to those of the embodiment described above may be achieved.

The embodiments described above may be appropriately combined with one another. In addition, the processing procedures and processing conditions used at this time may be similar to, for example, the processing procedures and processing conditions of the aforementioned embodiment.

EXAMPLES

Hereinafter, experimental results supporting the effects obtained from the aforementioned embodiment will be described.

As a sample 1, a process vessel after performing a process of forming an SiOC film on a wafer was prepared. Furthermore, as a sample 2, a process vessel after performing a process of forming an SiO film on a wafer was prepared. Then, the cleaning process illustrated in FIG. 5 was performed on the process vessels of samples 1 and 2 multiple times while changing the temperature condition and the pressure condition to evaluate etching selectivity of a deposit.

Furthermore, a film-forming process of sample 1 was performed by the processing procedures and processing conditions similar to those of the film-forming process illustrated in FIG. 4. In addition, a film-forming process of sample 2 was performed by alternately repeating a step of supplying an HCDS gas and a pyridine gas into the process vessel and a step of supplying an $H_2O$ gas and a pyridine gas into the process vessel.

(First Evaluation)

Figure 6:
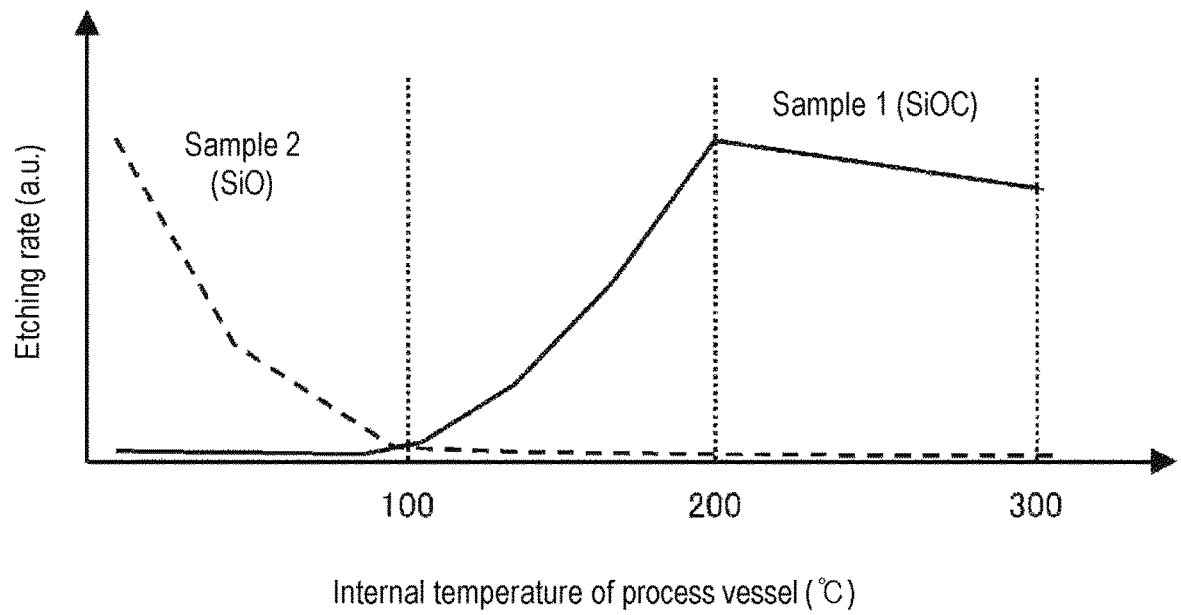
FIG. 6 is a diagram illustrating a first evaluation result of etching selectivity of a deposit.

In this evaluation, the internal temperature of the process vessel was changed within a range of 30 to 300 degrees C. when performing the cleaning process. Other processing conditions were set to predetermined conditions which fall within the processing condition range in the aforementioned embodiment. FIG. 6 shows evaluation results of this evaluation. In FIG. 6, the horizontal axis indicates an internal temperature (degrees C.) of the process vessel in the cleaning process and the vertical axis indicates an etching rate (a.u.) of a deposit. In FIG. 6, the solid line indicates an etching rate of a deposit (SiOC) adhered to the interior of the process vessel of sample 1 and the broken line indicates an etching rate of a deposit (SiO) adhered to the interior of the process vessel of sample 2.

According to FIG. 6, when the internal temperature of the process chamber is lower than 100 degrees C., it can be seen that the etching rate of SiO is larger than the etching rate of SiOC. Furthermore, since the etching rate of the quartz member shows the same tendency as the etching rate of the SiO, it is understood that the etching rate of the quartz member is larger than the etching rate of the SiOC. It is also understood that the etching rate of SiO is increased as the internal temperature of the process chamber decreases. That is, it can be seen that the lower the internal temperature of the process chamber, the larger the etching rate of the quartz member. In addition, according to FIG. 6, when the internal temperature of the process chamber is set at a temperature of 100 degrees C. or higher, it is understood that the etching rate of SiOC is larger than the etching rate of SiO. That is, it is understood that the etching rate of SiOC is larger than the etching rate of the quartz member. When the internal temperature of the process chamber is set at a temperature of 100 degrees C. or higher, it is also understood that the etching rate of SiO becomes very small, namely the etching reaction of SiO hardly goes ahead. That is, it can be seen that the etching rate of the quartz member becomes very small. Furthermore, it can also be seen that the etching rate of SiOC is increased as the internal temperature of the process vessel increases in the range of at least 200 degrees C. or lower. From these facts, it can be seen that, by setting the internal temperature of the process vessel in the cleaning process at a temperature of 100 degrees C. or higher, it is possible to efficiently remove the deposit containing C adhered to the interior of the process vessel while suppressing the etching damage of the quartz member in the process vessel. Moreover, the present inventors confirmed that, by setting the internal temperature of the process vessel at a temperature of 100 degrees C. or higher and 400 degrees C. or lower, the etching selectivity described above can be obtained. Furthermore, it was confirmed that, by setting the internal temperature of the process vessel at a temperature which falls within a range of 200 or higher and 300 degrees C. or lower, very high etching selectivity can be obtained. It was also confirmed that, by adopting the temperature and pressure conditions shown herein, the same etching selectivity can be obtained not only for the deposit containing C but also for the deposit containing N or the deposit containing C and N.

(Second Evaluation)

Figure 7:
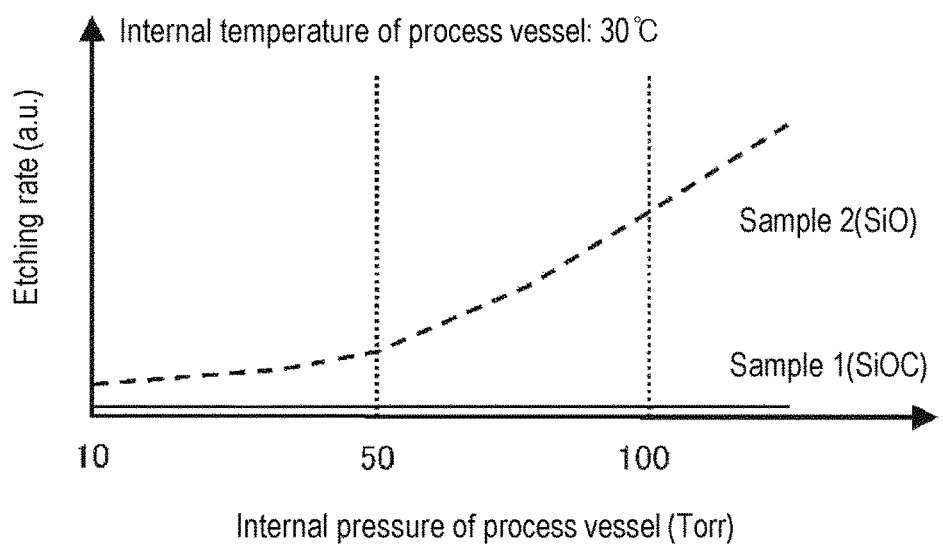
FIG. 7 is a diagram view illustrating a second evaluation result of etching selectivity of a deposit.

In this evaluation, the internal temperature of the process vessel was set at 30 degrees C. and the internal pressure of the process vessel was changed within a range of 10 to 150 Torr when performing the cleaning process. Other processing conditions were set to predetermined conditions which fall within the processing condition range in the aforementioned embodiment. FIG. 7 shows evaluation results of this evaluation. In FIG. 7, the horizontal axis indicates an internal pressure (Torr) of the process vessel in the cleaning process. The vertical axis, the solid line, and the broken line in FIG. 7 may be synonymous with those in FIG. 6, respectively.

According to FIG. 7, when the internal temperature of the process chamber is 30 degrees C., it can be seen that the etching rate of SiO is larger than the etching rate of SiOC under any pressure condition of 10 to 150 Torr. That is, when the cleaning temperature is set at 30 degrees C., it can be seen that it is difficult to remove the deposit containing C adhered to the interior of the process vessel while suppressing the etching damage of the quartz member in the process vessel.

(Third Evaluation)

Figure 8:
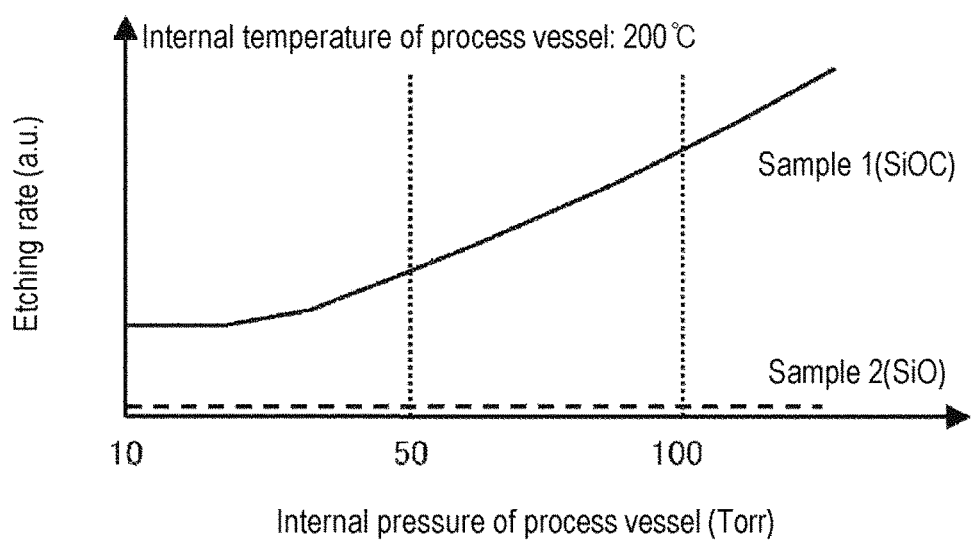
FIG. 8 is a diagram illustrating a third evaluation result concerning etching selectivity of a deposit.

In this evaluation, when the internal temperature of the process vessel was set at 200 degrees C. and the internal pressure of the process vessel was changed within a range of 10 to 150 Torr when performing the cleaning process. Other processing conditions were set to predetermined conditions which fall within the processing condition range in the aforementioned embodiment. FIG. 8 shows evaluation results of this evaluation. The horizontal axis, the vertical axis, the solid line, and the broken line in FIG. 8 may be synonymous with those in FIG. 7, respectively.

According to FIG. 8, when the internal temperature of the process chamber is 200 degrees C., it can be seen that the etching rate of SiOC is larger than the etching rate of SiO under any pressure condition of 10 to 150 Torr. That is, it can be seen that the etching rate of SiOC is larger than the etching rate of the quartz member. In other words, when the cleaning temperature was set at 200 degrees C., it can be seen that it is possible to remove the deposit containing C adhered to the interior of the process vessel while suppressing the etching damage of the quartz member in the process vessel. Furthermore, it can also be seen that the etching selectivity described above can be enhanced as the internal pressure of the process vessel increases within the range of at least 10 to 150 Torr. The present inventors confirmed that, by setting the internal pressure of the process vessel at a pressure of 10 Torr or more and 200 Torr or less, the etching selectivity described above can be obtained. It was also confirmed that, by setting the internal pressure of the process vessel at a pressure which falls within the range of 10 Torr or more and 200 Torr or less, very high etching selectivity can be obtained.

According to the present disclosure in some embodiments, it is possible to improve a cleaning efficiency in a process vessel after forming a film-forming process.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A cleaning method, comprising:
supplying a hydrogen fluoride gas into a process vessel, in which a process of forming a SiOC film on a substrate has been performed and a deposit containing SiOC has been adhered to an interior of the process vessel in the process of forming the SiOC film, to remove the deposit,
wherein a quartz member is provided in the process vessel, and
wherein the act of supplying the hydrogen fluoride gas includes setting an internal temperature of the process vessel to 100 degrees C. or higher and 400 degrees C. or lower.

2. The method of claim 1, wherein the act of supplying the hydrogen fluoride gas includes depressurizing the interior of the process vessel to 10 Torr or more and 200 Torr or less.

3. The method of claim 1, wherein the act of supplying the hydrogen fluoride gas includes setting the internal temperature of the process vessel higher than an internal temperature of the process vessel in the process of forming the SiOC film.

4. The method of claim 1, wherein a cycle is performed a predetermined number of times in the process of forming the SiOC film, the cycle including non-simultaneously performing:
supplying a precursor containing a predetermined element and a first catalyst to the substrate in the process vessel; and
supplying a reactant and a second catalyst to the substrate in the process vessel.

5. A method of manufacturing a semiconductor device, comprising:
forming a SiOC film on a substrate in a process vessel; and
supplying a hydrogen fluoride gas into the process vessel to remove a deposit containing SiOC that has been adhered to an interior of the process vessel in the act of forming the SiOC film,
wherein a quartz member is provided in the process vessel, and
wherein the act of supplying the hydrogen fluoride gas includes setting an internal temperature of the process vessel to 100 degrees C. or higher and 400 degrees C. or lower.

6. A substrate processing apparatus, comprising:
a process vessel in which a substrate is accommodated;
a first supply system configured to supply a film-forming gas to the substrate in the process vessel;
a second supply system configured to supply a hydrogen fluoride gas into the process vessel;
a heating mechanism configured to heat an interior of the process vessel; and
a controller configured to control the first supply system, the second supply system, and the heating mechanism to perform:
supplying the film-forming gas to the substrate in the process vessel to form a SiOC film on the substrate; and
supplying the hydrogen fluoride gas into the process vessel to remove a deposit containing SiOC that has been adhered to the interior of the process vessel in the act of supplying the film-forming gas,
wherein a quartz member is provided in the process vessel, and
wherein the act of supplying the hydrogen fluoride gas includes setting an internal temperature of the process vessel to 100 degrees C. or higher and 400 degrees C. or lower.

7. A non-transitory computer-readable recording medium storing a program that causes a substrate processing apparatus to perform a process by a computer, the process comprising:
forming a SiOC film on a substrate in a process vessel; and
supplying a hydrogen fluoride gas into the process vessel to remove a deposit containing SiOC that has been adhered to an interior of the process vessel in the act of forming the SiOC film,
wherein a quartz member is provided in the process vessel, and
wherein the act of supplying the hydrogen fluoride gas includes setting an internal temperature of the process vessel to 100 degrees C. or higher and 400 degrees C. or lower.

8. The method of claim 1, wherein the act of supplying the hydrogen fluoride gas includes setting the internal temperature of the process vessel to 100 degrees C. or higher and 300 degrees C. or lower.

9. The method of claim 1, wherein the act of supplying the hydrogen fluoride gas includes setting the internal temperature of the process vessel to 200 degrees C. or higher and 300 degrees C. or lower.

10. The method of claim 3, further comprising increasing the internal temperature of the process vessel, before the act of supplying the hydrogen fluoride gas, to be higher than the internal temperature of the process vessel in the process of forming the SiOC film.

11. The method of claim 10, further comprising decreasing the internal temperature of the process vessel, after the act of supplying the hydrogen fluoride gas, to the internal temperature of the process vessel in the process of forming the SiOC film.

12. The method of claim 1, wherein the act of supplying the hydrogen fluoride gas includes setting an internal pressure of the process vessel to 10 Torr or more and 100 Torr or less.

13. The method of claim 1, wherein the act of supplying the hydrogen fluoride gas includes:
setting the internal temperature of the process vessel to 100 degrees C. or higher and 300 degrees C. or lower, which is higher than an internal temperature of the process vessel in the process of forming the SiOC film; and
setting an internal pressure of the process vessel to 10 Torr or more and 100 Torr or less.

* * * * *